(12) United States Patent
Cobanoglu et al.

(10) Patent No.: US 11,008,679 B2
(45) Date of Patent: May 18, 2021

(54) WOVEN TEXTILE FABRIC

(71) Applicant: Sanko Tekstil Isletmeleri San. Ve Tic. A.S., Inegol-Bursa (TR)

(72) Inventors: Ozgur Cobanoglu, Inegol-Bursa (TR); Deniz Iyidogan, Inegol-Bursa (TR); Jitka Eryilmaz, Inegol-Bursa (TR); Ali Kemal Agirman, Inegol-Bursa (TR); Ozgur Akdemir, Inegol-Bursa (TR)

(73) Assignee: Sanko Tekstil Isletmeleri San. Ve Tic. A.S., Inegol-Bursa (TR)

(*) Notice: Subject to any disclaimer, the term of this patent is extended or adjusted under 35 U.S.C. 154(b) by 0 days.

(21) Appl. No.: 15/757,073

(22) PCT Filed: Oct. 10, 2016

(86) PCT No.: PCT/EP2016/074201
§ 371 (c)(1),
(2) Date: Mar. 2, 2018

(87) PCT Pub. No.: WO2017/063994
PCT Pub. Date: Apr. 20, 2017

(65) Prior Publication Data
US 2018/0171514 A1    Jun. 21, 2018

(30) Foreign Application Priority Data
Oct. 12, 2015 (EP) .................................. 15189432

(51) Int. Cl.
*D03D 1/00* (2006.01)
*D03D 7/00* (2006.01)
(Continued)

(52) U.S. Cl.
CPC ............. *D03D 7/00* (2013.01); *D03D 1/0088* (2013.01); *D03D 11/00* (2013.01); *D03D 15/00* (2013.01);
(Continued)

(58) Field of Classification Search
CPC . D03D 1/88; D03D 7/00; D03D 11/00; D03D 15/00; D03D 15/0027;
(Continued)

(56) References Cited

U.S. PATENT DOCUMENTS

| 8,395,317 B2 | 3/2013 | Bhattacharya |
| 2004/0046484 A1* | 3/2004 | Schiller ................. H01L 41/042 310/317 |

(Continued)

FOREIGN PATENT DOCUMENTS

| GB | 2516987 | 2/2015 |

OTHER PUBLICATIONS

First Office Action issued by the CN Patent Office dated Jun. 26, 2019 for corresponding CN application No. 201680044074.2 and relevant English translation and report from the Local agent.

(Continued)

*Primary Examiner* — Kenneth Bukowski
(74) *Attorney, Agent, or Firm* — Silvia Salvadori

(57) ABSTRACT

It is disclosed a woven textile fabric comprising a first and a second electrically conductive layer (20; 30) of interwoven conductive yarns (22, 24; 32, 34) and a first intermediate pseudo-layer (40) of structural and insulating yarns (45) comprised between the first and the second electrically conductive layer and a plurality of binding yarns (47) interlacing the first and second conductive layers (20; 30) and the intermediate layer (40). The structural yarns (45) and the binding yarns (47) have piezoelectric properties.

18 Claims, 4 Drawing Sheets

(51) Int. Cl.
  *D03D 11/00* (2006.01)
  *D03D 15/00* (2021.01)
  *D03D 15/47* (2021.01)
  *G01K 7/00* (2006.01)
  *G01L 5/00* (2006.01)
  *H01L 41/113* (2006.01)
  *H01L 41/18* (2006.01)
  *H02N 2/18* (2006.01)
  *G01L 9/08* (2006.01)

(52) U.S. Cl.
  CPC .............. *D03D 15/47* (2021.01); *G01K 7/003* (2013.01); *G01L 5/00* (2013.01); *H01L 41/1132* (2013.01); *H01L 41/183* (2013.01); *H02N 2/18* (2013.01); *D10B 2101/12* (2013.01); *D10B 2101/122* (2013.01); *D10B 2101/20* (2013.01); *D10B 2201/02* (2013.01); *D10B 2401/06* (2013.01); *D10B 2401/062* (2013.01); *D10B 2401/16* (2013.01); *D10B 2401/18* (2013.01); *D10B 2403/021* (2013.01); *G01L 9/08* (2013.01)

(58) Field of Classification Search
  CPC ............ D03D 1/0088; D10B 2101/122; D10B 2101/20; D10B 2201/02; D10B 2401/06; D10B 2401/062; D10B 2401/16; D10B 2401/18; D10B 2403/021; D10B 2101/12; G01K 7/003; G01L 5/00; G01L 9/08; G06F 3/0414; H01L 41/1132; H01L 41/183; H02N 2/18
  See application file for complete search history.

(56) References Cited

U.S. PATENT DOCUMENTS

2010/0154918 A1    6/2010  Li et al.
2014/0150573 A1*   6/2014  Cannard .............. D03D 1/0088
                                                    73/862.627
2014/0170920 A1*   6/2014  Manipatruni ........ D03D 1/0088
                                                    442/188

OTHER PUBLICATIONS

First Office Action issued by the BR Patent Office dated Jan. 28, 2020 for corresponding BR application No. BR112018000108-2 and relevant English translation and report from the Local agent.
European Search Report and written opinion dated Apr. 1, 2016 for European patent application No. 15189432.6.
International Search Report and written opinion dated Jan. 24, 2017 for PCT/EP2016/074201.
International Preliminary Report on Patentability dated Apr. 17, 2018 for PCT/EP2016/074201.

* cited by examiner

WOVEN TEXTILE FABRIC

RELATED APPLICATIONS

This application is the US national phase application of international application No. PCT/EP2016/074201, filed 10 Oct. 2016, which designates the US and claims priority to European application 15189432.6 filed 12 Oct. 2015, the contents of each of which are hereby incorporated by reference as if set forth in their entireties.

The present invention relates to a woven textile fabric in the fields of textile construction engineering and of flexible devices physics.

As it is known, textile research refers to any material made by interlacing fibres and traditionally deals with types of construction as well as the materials and methods of yarns to be used to create those constructions.

Textile construction design involves many constraints in such a way that the final fabric establishes a certain set of functions which have emerged as well as accepted as a result of a great amount of testing under a huge variety of conditions throughout human history.

Modern e-textile applications add other constraints to those above mentioned such as those enforced by electronics, communication, optics, chemistry and many others just to name a few.

US 2010/0154918 discloses an integrally-woven three-layer heating textile including a heat-isolated fabric layer, a thermal function fabric layer, a plurality of conductive yarns and a plurality of connecting yarns. The conductive yarn is distributed between the heat-isolated fabric layer and the thermal function fabric layer. The connecting yarn interlaces the heat-isolated fabric.

The connecting yarn interlaces the heat-isolated fabric layer and the thermal function fabric layer so that the conductive yarn is sandwiched between the heat-isolated fabric layer and the thermal function fabric layer.

U.S. Pat. No. 8,395,317 discloses a textile product having a multi-layer warp which includes an upper warp layer comprising an upper array of conductive warp yarns, a lower warp layer comprising a lower array of conductive warp yarns, and an intermediate warp layer arranged between the upper and lower warp layers. The textile further includes a weft in which a first set of conductive weft yarns cross the upper array of conductive warp yarns, such that electrical contact is achieved there between, and a second set of conductive weft yarns cross the lower array of conductive warp yarns, such that electrical contact is achieved there between.

The second set of conductive weft yarns form loops around non-conductive warp yarns in the upper and intermediate warp layers, each of the loops providing a first upper layer connection point for enabling connection of an electronic device, such as a LED, between the first upper layer connection point and a second upper layer connection point.

As is known, piezoelectric properties manifest themselves as an electric charge generated in certain materials in response to an applied mechanical stress. In general, piezoelectric materials develop electrical potential across defined layers of the material upon pressure, strain or pulses or a combination thereof.

The piezoelectric effect is reversible, i.e. the materials in which an electrical charge is generated from an applied mechanical stress also exhibit the internal generation of a mechanical strain resulting from an applied electrical field. Piezoelectric phenomena are known and have been studied for more than a century.

Piezoelectric devices are used in many technical fields, for example in valves and for energy harvesting and for sensing applications. In particular, energy harvesting in textiles has been actively investigated; to this purpose piezoelectric yarns have been provided.

It is an aim of the present invention to create a general purpose multi-electrode textile fabric that may also be able to generate and/or harvest electricity.

These and other aims are achieved by a woven textile fabric comprising:
- a first electrically conductive layer of interwoven conductive yarns;
- a second electrically conductive layer of interwoven conductive yarns;
- a first intermediate layer of structural yarns comprised between the first and the second electrically conductive layer, and
- a first plurality of binding yarns interlacing the first and second conductive layers and the intermediate layer, wherein said structural yarns and said binding yarns have piezoelectric properties.

An advantage of this invention is that is can be used in a multiplicity of application, such as energy generation, energy harvesting, pressure sensor and so on.

Preferred embodiments are the object of dependent claims.

The invention will now be described in greater detail, by way of example, with reference to the accompanying non limiting drawings, wherein like numerals denote like elements, and in which.

Exemplary embodiments will now be described with reference to the enclosed drawings without intent to limit application and uses.

Figure 1:
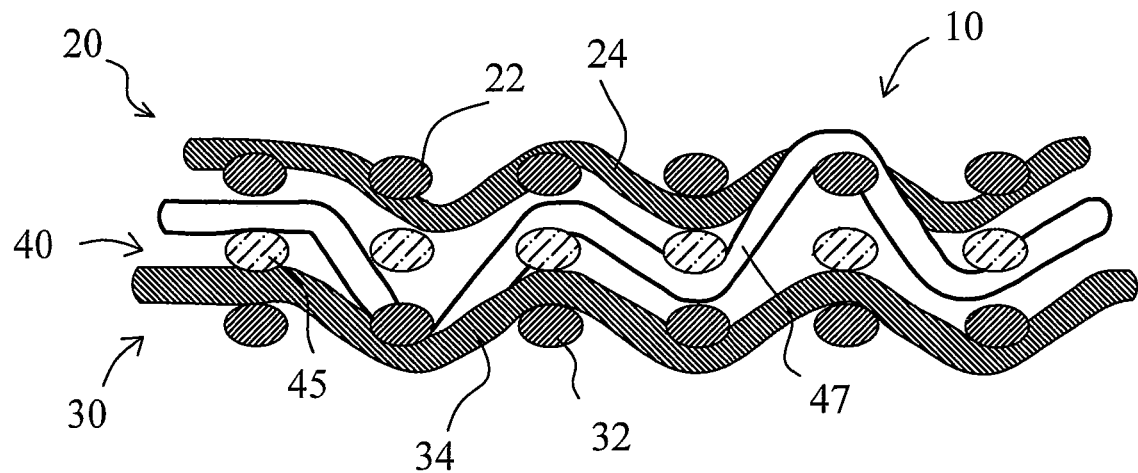
FIG. 1 shows a repeating cell of a woven textile fabric according to a first embodiment of the invention.

In FIG. 1 a repeating cell of a woven textile fabric 10, according to a first embodiment of the invention is represented The woven textile fabric 10 of FIG. 1 comprises a first electrically conductive layer 20 made by interwoven conductive yarns 22, 24 and a second electrically conductive layer 30 of interwoven conductive yarns 32, 34.

Between the first and the second electrically conductive layer 20, 30, it is provided an intermediate layer 40 made of structural yarns 45

The woven textile fabric 10 further comprises a plurality of binding yarns 47 interlacing the first and second conductive layers 20, 30 together with the intermediate layer 40.

The first and second electrically conductive layer 20, 30 are formed by crossing conductive yarns perpendicular to each other to form a grid, therefore, an electrode pseudo-layer is formed.

The structural yarns 45 and the binding yarns 47 have piezoelectric properties and in turn form an intermediate pseudo-layer 40 establishing electrical insulation between the conductive layers, namely form an insulating layer formed by yarns (FIG. 1).

Throughout the present description, the term pseudo-layer will be used as a synonym of functional layer, since a textile fabric—even though physical layers can also exist in it—is not necessarily always formed by perfectly defined physical layers, but instead, according to the various embodiments of the invention, some functional regions of the woven textile fabric may be provided with definite functional properties, such as electrical conductivity, electrical isolating properties, piezoelectricity and so on.

To make the structural yarns 45 and the binding yarns 47 having insulating properties, the following materials may be used.

A possible choice is Polyvinylidene fluoride (PVDF) and its piezoelectric derivatives.

Other materials that may be used are Polytetrafluoroethylene (PTFE) Lead zirconate titanate (PZT), Barium Titanate, gallium phosphate, tourmaline, lead magnesium niobate-lead titanate (PMN-PT), zinc oxide, and others, either used as they are cast into fibers or as nano- or micro-particles dispersed within a matrix material.

The binding yarns 47 cross upper portions of the first electrically conductive layer 20 and bottom portions of the second electrically conductive layer 30 or viceversa to create an interlaced structure, namely the woven textile fabric 10.

Figure 2:
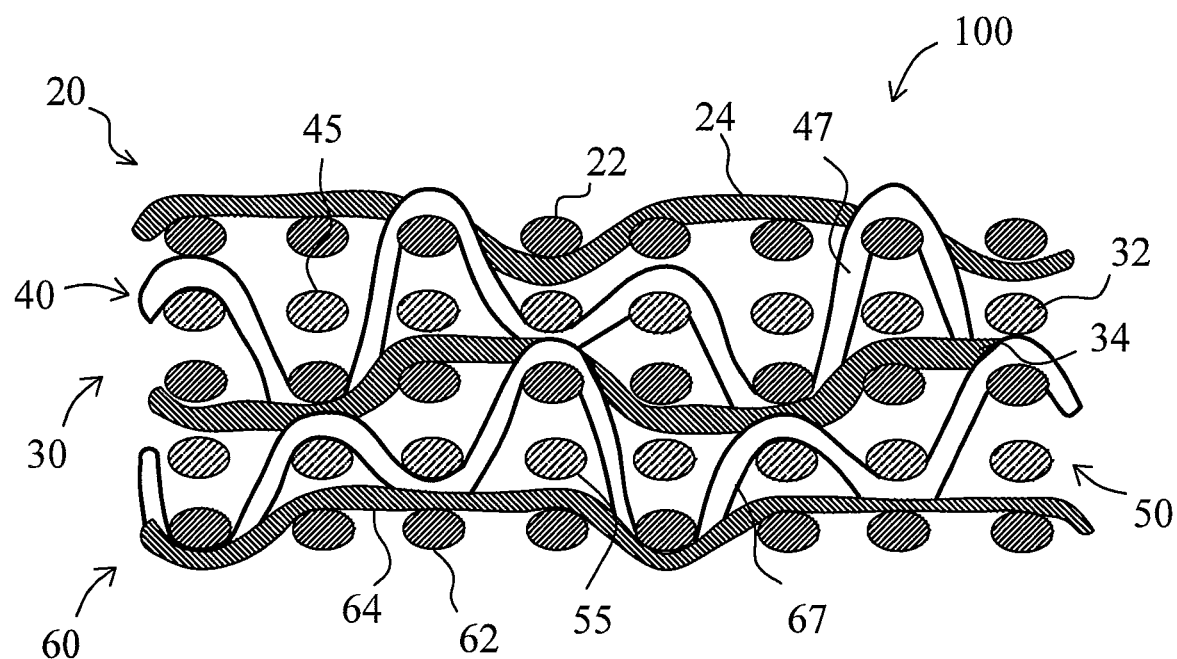
FIG. 2 shows a repeating cell of a woven textile fabric according to a second embodiment of the invention.

In FIG. 2 a repeating cell of a woven textile fabric 100, according to a second embodiment of the invention is represented.

The woven textile fabric 100 according to the embodiment of FIG. 2 further comprises a second intermediate layer 50 made of structural yarns 55 and a third electrically conductive layer 60 of interwoven conductive yarns 62, 64 comprised between the second and the third electrically conductive layer 30, 60.

The woven textile fabric 100 further comprises a plurality of binding yarns 67 interlacing the second and the third electrically conductive layer 30, 60 with the second intermediate layer 50 comprised therein.

In such a way, since the first and the second conductive layers 20, 30 are interlaced together by the binding yarns 47 and the second and the third conductive layers 30, 60 are interlaced together by the binding yarns 67, the woven textile fabric 100 forms an integral textile structure.

The structural yarns 55 of the second intermediate layer 50 and the binding yarns 67 of the second plurality of binding yarns 67 have piezoelectric properties. The second intermediate layer 50 forms an intermediate pseudo-layer 50 establishing electrical insulation between the conductive layers, namely forms an insulating layer formed by yarns (FIG. 2).

To make the structural yarns 55 of the second intermediate layer 50 and the binding yarns 67 of the second plurality of binding yarns having insulating properties, the following materials may be used.

A possible choice is Polyvinylidene fluoride (PVDF) and its piezoelectric derivatives.

Other materials that may be used are Polytetrafluoroethylene (PTFE) Lead zirconate titanate (PZT), barium Tttanate, gallium phosphate, tourmaline, lead magnesium niobate-lead titanate (PMN-PT), zinc oxide, and others, either used as they are cast into fibers or as nano- or micro-particles dispersed within a matrix material.

In both the embodiments of FIGS. 1 and 2, the woven fabric constructions form multiple discrete pseudo-layers stacked on top of each other.

For example, in the embodiments of FIG. 1, electrically conductive layers 20, 30 are separated by intermediate layer 40, thus the whole fabric structure 10 may operate as electrodes separated by an intermediate layer.

As it will be apparent in the following description, the above structures have great versatility and can be used in a wide number of different applications.

In a first application, the structural yarns 45, 55 may be provided with piezoelectric properties. Also, the binding yarns 47, 67 may be provided with piezoelectric properties.

As is known, piezoelectric properties manifest themselves as an electric charge generated in certain materials in response to an applied mechanical stress. In general, piezoelectric materials develop electrical potential across defined layers of the material upon pressure, strain or pulses or a combination thereof.

The textile fabric so realized may be used to generate an electrical potential across the electrically conductive layers 20, 30.

Concerning the piezoelectric yarns, a first possibility is that such piezoelectric yarns are polarized elsewhere and already possess piezoelectric properties at the time where the fabric is woven. Such piezoelectric properties can be obtained by orientation or polarization of polymeric materials under strong electric field gradients and heat.

A second possibility is to perform a heat treatment under an electric field gradient across the electrically conductive layers 20, 30 in order to provide piezoelectric properties to the insulating yarns and to the binding yarns.

Figure 3:
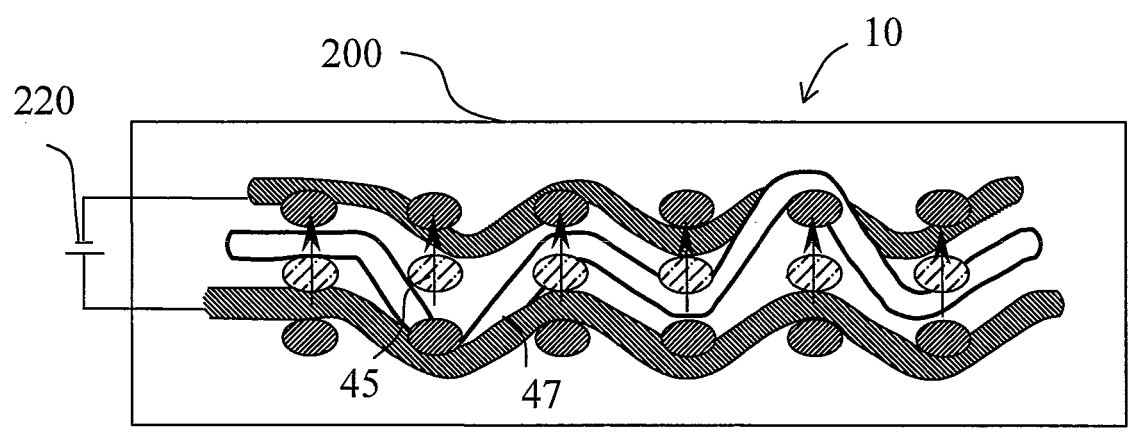
FIG. 3 shows polarization of piezoelectric components in a woven textile fabric according to an embodiment of the invention.

The material of these yarns can be selected such that they can be polarized under heat exceeding their glass-transition temperature (Tg), for example by inserting the whole fabric in a polarization oven 200, and the unit piezoelectric dipoles forming the yarn can be aligned accordingly in case of an electric field gradient generated, for example, by means of battery 220 and applied across consecutive pseudo-electrode layers as seen in FIG. 3. The arrows in FIG. 3 show the polarization direction.

Figure 4:
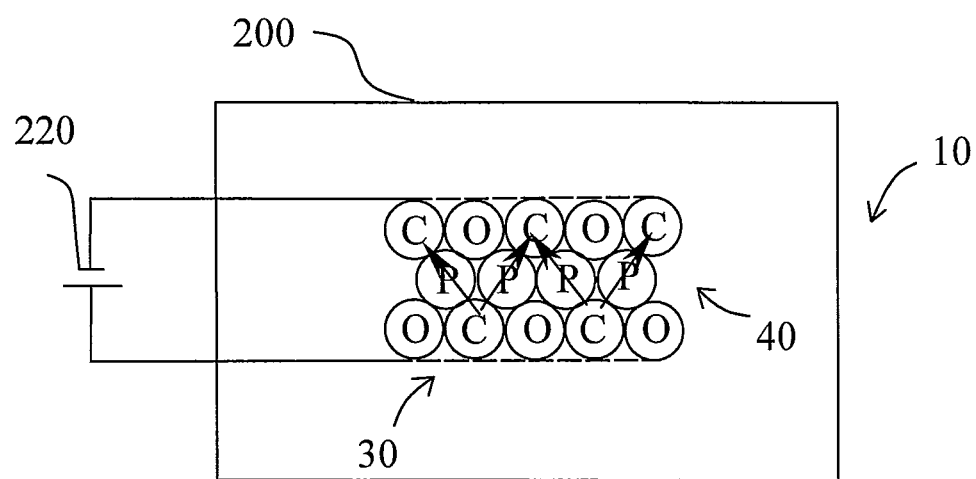
FIG. 4 shows polarization of piezoelectric components in a woven textile fabric according to another embodiment of the invention.

Another possibility is to obtain the benefit of self-maximization of piezoelectric response as the yarns move within the construction until they converge to their final locations. This, therefore, requires polarization of the yarns in different directions with respect to where the two current collecting electrodes reside, in order to maximize the piezoelectric gain, as depicted in FIG. 4. Also, as in the previous FIG. 3, the arrows of FIG. 4 show the polarization direction.

Furthermore, in the structure represented in FIG. 4, the different materials that compose the textile fabric 10 have been indicated as C for conductor yarns, P for piezoelectric yarns and with O for ordinary or conventional yarns, namely for example cotton, inserted into the fabric to establish the textile properties in terms of look-and-feel. Among the textile properties established are also dye-ability, moisture management and drape.

The final fabric may be used as energy harvester, namely using the process by which energy is derived from an external source, captured and stored.

The respective yarns will be all piezoelectric and conductive or partially piezoelectric and conductive yarns are used if the final fabric is utilized as a sensor.

Conventional and/or conductor yarn density can be adjusted in configurations different from the one represented in FIG. 4 for fine tuning of electric and/or textile properties of the fabric, depending on the applications.

To make the conductive yarns, a possibility is to use yarns made of a conventional textile material (natural and synthetic), such as cotton, the textile material being coated with a conductive material such as nano-sheets of graphene, nano-particles of carbon black, amorphous carbon, nano-tubes or nano-ribbons of carbon or a layer of an intrinsically conductive polymer such as polypyrroles.

Further possibilities to make the conductive yarns are: a blend of cotton and steel or cotton and steel twisted and nano-sheet or nano-particle or nano-rod coated or impregnated or doped on cotton or on polyester (PES) and so on. Other materials such as silver and copper can also be used as the conducting components in a variety of ways well known in the art.

Generally speaking the woven textile fabric according to the various embodiments of the invention can be used for several different applications.

A first application is as energy harvester to power low-power electronic nodes such as sensor arrays or locally powered electronics of any kind.

A second possible use is as a tap sensor (or input device) to control other devices such as a human interface used to interact with a software, A further possibility is as a component of a hit sensor for emergency situations.

Still another possibility is as a component of a heat sensor due to pyroelectric features of some piezoelectric materials such as PVDF and other.

A final example may be as a touch or tap or hit sensor for sports such as basketball, for example in cases where the referees cannot directly see if a player got really hit, as such events might be visually hindered and so on.

Generally speaking the use examples of the fabric rely mostly from the ability of the fabric disclose herein to transduce mechanical stimulus into electric signal generation, however, in principle the woven textile fabric of the various embodiments of the invention may also be used as actuators by means of the application of alternating electric potential to produce vibrations of small amplitude.

Figure 5:
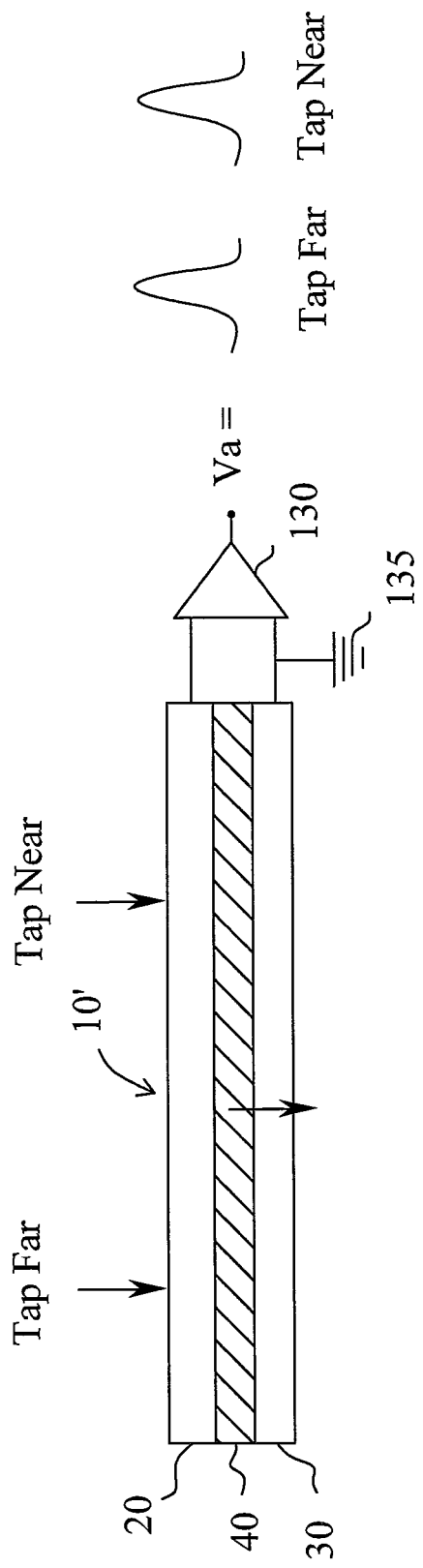
FIGS. 5 and 6 represent different embodiment of a sensor employing a woven textile fabric according to the various embodiments of the invention.
Figure 6:
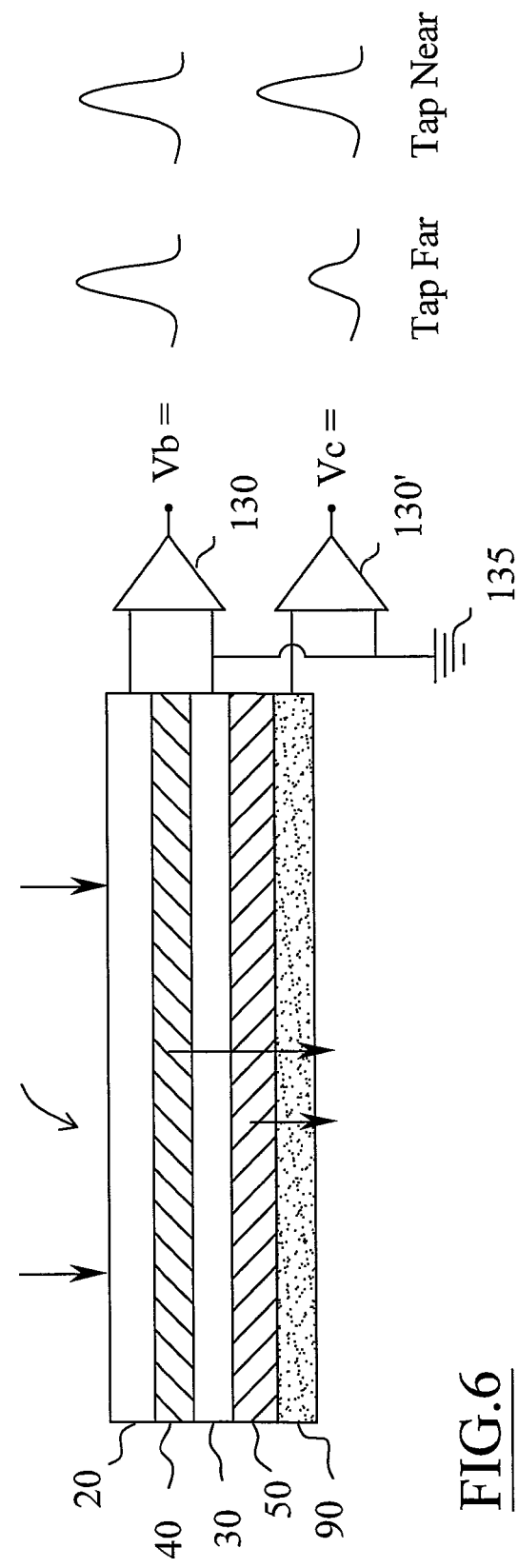

Still another example is given in FIGS. 5 and 6 which represent different embodiment of a sensor 10' and 120 employing a woven textile fabric according to the various embodiments of the invention.

In the sensor 10' of FIG. 5 the first and second electrically conductive layers 20 and 30 have substantially the same electrical conductivity and an intermediate isolating layer 40 is comprised between the first and second electrically conductive layers 20 and 30.

As a pressure is applied on a top face of the sensor 10' an electrical pulse is generated and a tap signal Va may be sensed by the electronic end of the sensor 10', namely an operational amplifier 130 connected to a ground reference 135.

The sensor 10' is capable of sensing pressure of a top face thereof, but is not able to discriminate the position of the force applied.

In the sensor 120 of FIG. 6, the first and second electrically conductive layers 20 and 30 have substantially the same electrical conductivity, but a third electrically conductive layer 90 has an electrical conductivity substantially lower than the electrical conductivity of the first and second electrically conductive layers 20 and may function as a resistive layer.

The middle conductive pseudo-layer is chosen to be the ground 135 or the reference against which the signals are read-out. A tap or any physical stimuli which can generate an electric pulse at a certain location on the fabric travels to the contact where the front-end electronics are attached as seen in FIG. 6, namely the operational amplifiers 130, 130'.

Position sensitivity is established by taking the ratio between the two signals Vb and Vc: i) as a ratio close to 1 represents that the stimulus is applied or the charge is generated at a location very close to where the front-end electronics reside whereas ii) the ratio will be much smaller than 1 if the charge is generated in a distant location to the front-end as the signal on the resistive pseudo-layer has to travel a long distance and gets weakened due to IR potential drop throughout its path on the resistive layer 90.

Any value in-between will give approximate location where the charge is generated, hence position sensitivity.

Possible applications of the yarn structure of the invention are, among others, i) wearable sensor technology for body position monitoring in fabric form and ii) tensile monitoring of ropes used in a variety of areas from mountain climbing to heavy marine applications.

Figure 7:
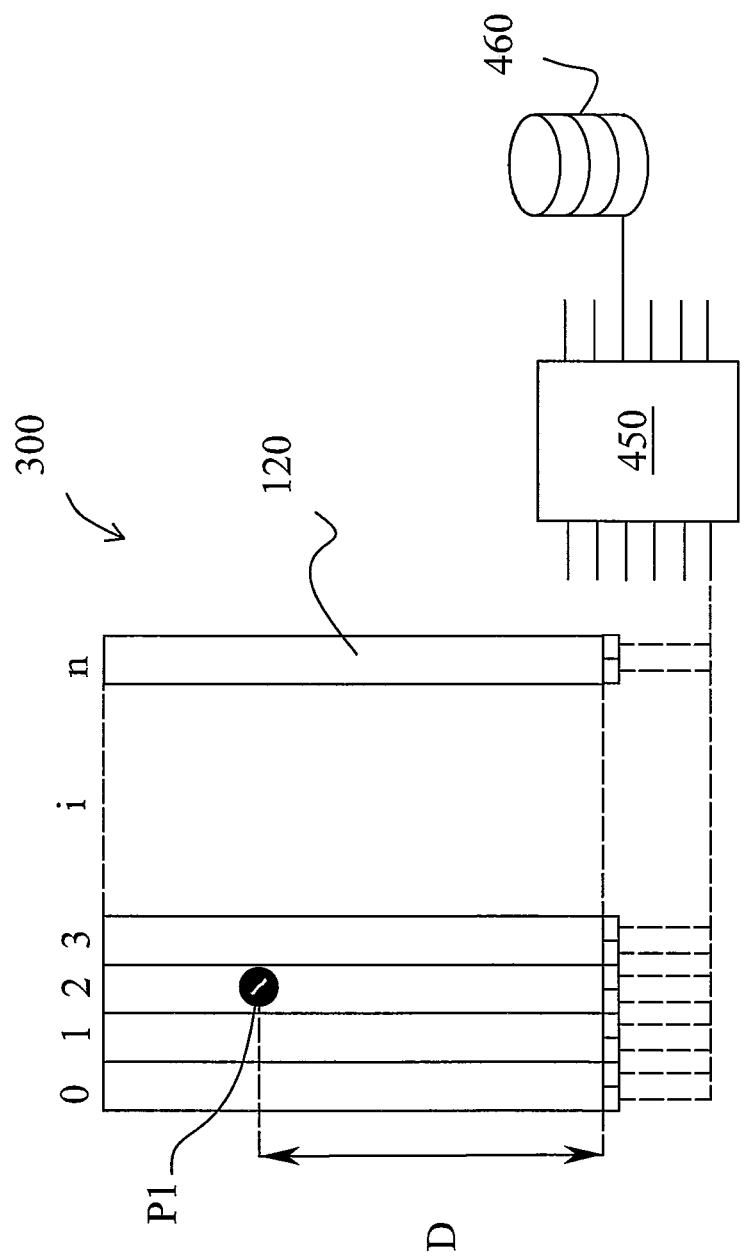
FIG. 7 represents an embodiment of a tap-sensitive screen employing sensors according to the embodiment of FIG. 6.

A further possible application is a planar tap sensitive screen 300 implemented as a textile fabric (FIG. 7).

The tap sensitive screen 300 can be implemented as a series of stripes, each stripe corresponding to a sensor 120 according to the embodiment of FIG. 6, each of the strips being identified with an index 1-$n$ stored in a memory unit 460 of the tap-sensitive screen, the memory unit 460 being connected to an electronic control unit 450 of the tap sensitive screen 300.

For example a stripe index may represent a first coordinate X and the Vb/Vc ratio can represent the other coordinate on the plane hence the location on an X-Y plane is known.

In other words, each of the strips is composed by a textile fabric position sensor such as the one depicted in FIG. 6 and the strips are ordered in a parallel fashion along a direction perpendicular to the longitudinal direction of the strips themselves, each of the strips being identified with an index stored in a memory unit of the tap-sensitive screen.

An electronic unit 450 connected to the screen is able to associate the information on the distance from the operational amplifiers of the particular strip touched with the index identifying such particular strip and so determine the point touched on the textile screen.

In the example of FIG. 7, point P1 is touched on the strip indexed with numeral 2 at distance D from the operational amplifiers 130, 130' connected to say strip.

In the woven textile fabric according to any of the described embodiments, adjacent layers may be reciprocally contacted in order to allow electrical current to flow through an external circuitry.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents.

The invention claimed is:

1. A woven textile fabric (10) comprising:
   a first electrically conductive layer (20) of interwoven conductive yarns (22,24);
   a second electrically conductive layer (30) of interwoven conductive yarns (32,34);
   a first intermediate layer (40) of structural yarns (45) disposed between the first and the second electrically conductive layer (20, 30), and
   a first plurality of woven interconnecting piezoelectric binding spacer yarns (47) interlacing the first and second conductive layers (20,30) and the structural yarns (45) of the intermediate layer (40), wherein said structural yarns (45) and said first plurality of woven interconnecting piezoelectric binding spacer yarns (47) both have piezoelectric properties,
   and wherein said structural yarns (45) and said first plurality of woven interconnecting piezoelectric binding spacer yarns (47) are woven together and contact each other in such a way that adjacent layers are reciprocally contacted to allow electrical current to flow through an external circuitry.

2. The woven textile fabric (10) according to claim 1, wherein said structural yarns (45) and said first plurality of woven interconnecting piezoelectric binding spacer yarns (47) are polarized under heat exceeding their glass-transition temperature (Tg) and under an electric field to provide piezoelectric properties to the yarns (45,47).

3. The woven textile fabric (10) according to claim 1, wherein the first plurality of woven interconnecting piezolectric binding spacer yarn (47) cross upper portions of the first electrically conductive layer (20) and bottom portions of the second electrically conductive layer (20) or viceversa.

4. The woven textile fabric (10) according to claim 1, wherein the first intermediate layer (40) of structural yarns (45) is an electrically insulating layer.

5. The woven textile fabric (10) according to claim 1, wherein the conductive yarns (22,24) are made of natural or synthetic material coated with a conductive material.

6. The woven textile fabric (10) according to claim 5, wherein the conductive material coating the conductive yarns (22,24) comprises nano-sheets of graphene, nanoparticles of carbon black, amorphous carbon, nano-tubes or nanoribbons of carbon,_ or a layer of an intrinsically conductive polymer.

7. The woven textile fabric (10) according to claim 1, wherein the conductive yarns (22,24) are made of a blend of cotton and steel or cotton and steel twisted and nano-sheet or nano-particle or nano-rod coated or impregnated or doped on cotton or on polyester (PES).

8. The woven textile fabric (10) according to claim 1, further comprising:
   a second intermediate layer (50) of structural yarns (55);
   a third electrically conductive layer (60) of interwoven conductive yarns (62,64);
   the second intermediate layer (50) being comprised between the second and the third electrically conductive layer (30, 50), and
   a second plurality of binding yarns (67) interlacing the second and the third electrically conductive layer (30) and the second intermediate layer (50), wherein the structural yarns (55) of the second intermediate layer (50) and said binding yarns (67) of the second plurality of binding yarns (67) have piezoelectric properties.

9. The woven textile fabric (10) according to claim 8, wherein the first and second electrically conductive layers (20, 30) have substantially the same electrical conductivity, and the third electrically conductive layer (60) has an electrical conductivity substantially lower than the electrical conductivity of the first and second electrically conductive layers (20, 30) and the intermediate layers (40, 50) have the same piezoelectric properties.

10. A tap-sensitive screen (300) comprising:
    a plurality of textile fabric position sensors including the woven textile fabric of claim 9, the textile fabric position sensors being configured in the form of textile strips, the strips being ordered in a parallel fashion along a direction perpendicular to the longitudinal direction of the strips, each of the strips being identified with an index (1-$n$) stored in a memory unit (450) of the tap-sensitive screen (300).

11. The woven textile fabric (10) according to claim 8, wherein the second intermediate layer (50) of structural yarns (55) is an electrically insulating layer.

12. A textile fabric position sensor comprising the woven textile fabric of claim 8 and operational amplifiers (130, 130') configured to generate electrical signals (Vb, Vc), wherein the ratio between said electrical signals is proportional to the distance of a tap position with respect to the operational amplifiers (130,130').

13. The woven textile fabric (10) according to claim 1, wherein the structural yarns (45,55), the first plurality of woven interconnecting piezolectric binding spacer yarn (47) and the second plurality of binding yarns (67) comprise a material chosen from the group consisting of Polyvinylidene fluoride (PVDF) and its piezoelectric derivatives, Polytetrafluoroethylene (PTFE), Lead zirconate titanate (PZT), barium titanate, gallium phosphate, tourmaline, lead magnesium niobate-lead titanate (PMN-PT), and zinc oxide.

14. The woven textile fabric (10) according to claim 13, wherein the materials used for the structural yarns (45,55), the first plurality of woven interconnecting piezolectric binding pacer yarn (47) and the second plurality of binding yarns (67) are cast into fibers or are used as nano- or micro-particles dispersed within a matrix material.

15. A textile fabric position sensor comprising the woven textile fabric of claim 1 and an operational amplifier (130) configured to generate an electrical signal (Va) in response to a tap pressure on the textile fabric.

16. An article comprising a textile fabric (10) according to claim 1.

17. The article according to claim 16, wherein said article is selected from the group consisting of an energy harvester to power low-power electronic nodes, a hit sensor for emergency situations, a heat sensor, and a garment.

18. The article according to claim 17, wherein said article is said garment, said garment is a sport garment and said textile fabric is a touch sensor or tap sensor or hit sensor.

* * * * *